United States Patent
Cui et al.

(10) Patent No.: US 9,618,841 B2
(45) Date of Patent: Apr. 11, 2017

(54) $CU_2ZN_{0.14}SN_{0.25}TE_{2.34}$ NANOCRYSTALLINE SOLUTION, ITS PREPARATION METHOD, PHOTOSENSITIVE RESIN SOLUTION, METHOD FOR FORMING BLACK MATRIX, AND COLOR FILTER SUBSTRATE

(71) Applicant: BOE TECHNOLOGY GROUP CO., LTD., Beijing (CN)

(72) Inventors: Ying Cui, Beijing (CN); Yingying Song, Beijing (CN); Ze Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 15 days.

(21) Appl. No.: 14/646,168

(22) PCT Filed: Nov. 5, 2014

(86) PCT No.: PCT/CN2014/090385
§ 371 (c)(1),
(2) Date: May 20, 2015

(87) PCT Pub. No.: WO2015/188577
PCT Pub. Date: Dec. 17, 2015

(65) Prior Publication Data
US 2015/0355376 A1    Dec. 10, 2015

(30) Foreign Application Priority Data

Jun. 9, 2014 (CN) .......................... 201410252354

(51) Int. Cl.
*G03F 7/00* (2006.01)
*G02B 5/00* (2006.01)

(52) U.S. Cl.
CPC ............ *G03F 7/0007* (2013.01); *G02B 5/003* (2013.01)

(58) Field of Classification Search
CPC .............................. G02B 1/02; H01L 51/5284
See application file for complete search history.

(56) References Cited

U.S. PATENT DOCUMENTS

| 4,252,671 A | 2/1981 | Smith | |
|---|---|---|---|
| 2006/0263593 A1* | 11/2006 | Aziz | ............... H01L 51/5284 428/328 |

(Continued)

FOREIGN PATENT DOCUMENTS

| CN | 101659394 A | 3/2010 |
|---|---|---|
| CN | 101928467 A | 12/2010 |

(Continued)

OTHER PUBLICATIONS

Feb. 17, 2015—(CN)—First Office Action Appn 201410252354.5 with Eng Tran.

(Continued)

*Primary Examiner* — Alex A Rolland
(74) *Attorney, Agent, or Firm* — Banner & Witcoff, Ltd.

(57) ABSTRACT

The present invention relates to a $Cu_2Zn_{0.14}Sn_{0.25}Te_{2.34}$ nanocrystalline solution, its preparation method, a photosensitive resin solution, a method for forming black matrixes (BMs), and a color filter (CF) substrate. As the particle size of nanocrystallines in the nanocrystalline solution is small and light within the ultraviolet-visible light range can be absorbed, the BMs formed by utilization of the nanocrystalline solution can obtain good light shielding performance while having a small thickness. In the nanocrystalline solution, the particle size of the nanocrystallines dispersed in the nanocrystalline solution is 5 to 20 nm; the band gap of the nanocrystallines is 0.8 to 1.5 ev, and the grain surface of the nanocrystallines has organic functional groups.

11 Claims, 2 Drawing Sheets

(56) References Cited

U.S. PATENT DOCUMENTS

| | | |
|---|---|---|
| 2008/0124831 A1 | 5/2008 | Robinson et al. |
| 2008/0139688 A1* | 6/2008 | Kamata ................ C07C 323/52 |
| | | 522/49 |
| 2012/0048378 A1 | 3/2012 | Deligianni et al. |
| 2014/0096826 A1 | 4/2014 | Todorov |
| 2014/0099749 A1 | 4/2014 | Hong et al. |

FOREIGN PATENT DOCUMENTS

| | | |
|---|---|---|
| CN | 102007450 A | 4/2011 |
| CN | 102103327 A | 6/2011 |
| CN | 102849685 A | 1/2013 |
| CN | 103221471 A | 7/2013 |
| CN | 103842289 A | 6/2014 |
| CN | 104031459 A | 9/2014 |
| WO | 2011066256 A1 | 6/2011 |
| WO | 2011066273 A1 | 6/2011 |
| WO | 2012112491 A1 | 8/2012 |

OTHER PUBLICATIONS

Mar. 11, 2015—(WO) Written Opinion of ISA—Intl App PCT/CN2014/090385—English Translation.

* cited by examiner

$Cu_2Zn_{0.14}Sn_{0.25}Te_{2.34}$ NANOCRYSTALLINE SOLUTION, ITS PREPARATION METHOD, PHOTOSENSITIVE RESIN SOLUTION, METHOD FOR FORMING BLACK MATRIX, AND COLOR FILTER SUBSTRATE

The application is a U.S. National Phase Entry of International Application No. PCT/CN2014/090385 filed on Nov. 5, 2014, designating the United States of America and claiming priority to Chinese Patent Application No. 201410252354.5 filed on Jun. 9, 2014. The present application claims priority to and the benefit of the above-identified applications and the above-identified applications are incorporated by reference herein in their entirety.

TECHNICAL FIELD

Embodiments of the present invention relate to nanotechnology in the field of display technology, in particular to a $Cu_2Zn_{0.14}Sn_{0.25}Te_{2.34}$ nanocrystalline solution, a preparation method, a photosensitive resin solution, a method for forming black matrixes (BMs), and a color filter (CF) substrate.

BACKGROUND

Currently, in order to improve the contrast between pixels and avoid reduction in the display quality due to light mixing between adjacent pixels, a latticed black film layer provided with BMs is disposed between pixels of a CF substrate.

In the conventional process of forming BMs, the method of forming patterns by depositing and etching chromium (Cr) as a pigment on the entire glass substrate is used. The forming process is complex and meanwhile has the problems such as high reflectance of the raw material Cr and environmental pollution due to easy production of Cr waste.

Therefore, the researchers have developed a method of dispersing black pigment (e.g., carbon black) in a resin layer and utilizing the light absorption characteristic of black pigment to achieve a light shielding effect. However, BMs formed by dispersing the black pigment in the resin layer still have the following defects:

Firstly, as the majority of black pigment (e.g., carbon black) has a larger particle size (typically in micron level) and has poor dispersivity in resin, solvent and the like, the film uniformity and the film forming adhesion of the BMs can be adversely affected.

Secondly, in order to ensure good light shielding effect of the BMs, the usage amount of the black pigment has to be greatly increased, so that the overall thickness of the resin layer can be larger, and hence the overall flatness of the CF substrate can be reduced, and consequently the display quality can be degraded.

In view of this, a novel light shielding material with a better light shielding performance and a smaller particle size is urgently needed by those skilled in the art.

SUMMARY

Embodiments of the present invention provide a $Cu_2Zn_{0.14}Sn_{0.25}Te_{2.34}$ nanocrystalline solution, a preparation method, a photosensitive resin solution, a method for forming BMs, and a CF substrate. As the particle size of the nanocrystallines in the nanocrystalline solution is smaller and light within the ultraviolet-visible light range can be absorbed, the BMs formed by utilization of the nanocrystalline solution can obtain good light shielding performance while having a small thickness.

At least one embodiment of the present invention provides a $Cu_2Zn_{0.14}Sn_{0.25}Te_{2.34}$ nanocrystalline solution. The particle size of $Cu_2Zn_{0.14}Sn_{0.25}Te_{2.34}$ nanocrystallines dispersed in the $Cu_2Zn_{0.14}Sn_{0.25}Te_{2.34}$ nanocrystalline solution is 5 to 20 nm; the band gap of the $Cu_2Zn_{0.14}Sn_{0.25}Te_{2.34}$ nanocrystalline is 0.8 to 1.5 ev; and the grain surface of the $Cu_2Zn_{0.14}Sn_{0.25}Te_{2.34}$ nanocrystalline has organic functional groups such as a long-chain alkyl, an amino and a carbonyl.

At least one embodiment of the present invention provides a method for preparing a $Cu_2Zn_{0.14}Sn_{0.25}Te_{2.34}$ nanocrystalline solution. The method comprises: adding 0.1 to 1 mmol copper acetylacetonate, 0.2 to 2 mmol zinc acetylacetonate and 0.1 to 1 mmol stannous chloride into 5 to 50 ml oleyl amine to form a mixed solution; heating the mixed solution up to 100-150° C., performing vacuum pumping until no bubble is produced in the mixed solution, stopping vacuum pumping, and introducing nitrogen, argon or other inert gas into the mixed solution; heating the mixed solution up to 120-180° C., and adding 1 to 10 ml of 1 mol/L tributyl phosphate-tellurium (TBP-Te) precursor solution into the mixed solution; heating the mixed solution up to 150-220° C., and reacting for 5 to 10 min; and cooling the mixed solution to the room temperature after the reaction process is over and adding a dispersant into the mixed solution to obtain the $Cu_2Zn_{0.14}Sn_{0.25}Te_{2.34}$ nanocrystalline solution.

For instance, elemental tellurium is dissolved in a tributyl phosphate (TBP) solvent under the protection of protective atmosphere such as nitrogen and argon to obtain the TBP-Te precursor solution.

For instance, the step of cooling the mixed solution to the room temperature after the reaction process is over and adding the dispersant into the mixed solution to obtain the $Cu_2Zn_{0.14}Sn_{0.25}Te_{2.34}$ nanocrystalline solution includes: cooling the mixed solution to the room temperature after the reaction process is over and adding n-hexane into the mixed solution to obtain the $Cu_2Zn_{0.14}Sn_{0.25}Te_{2.34}$ nanocrystalline solution, in which the volume of the n-hexane added is 5 to 10 times the volume of the mixed solution.

At least one embodiment of the present invention provides a photosensitive resin solution. The photosensitive resin solution is used for forming BMs and includes a light shielding material, an organic solvent and a resin, in which the light shielding material comprises a ternary or quaternary compound of Cu, Zn, Sn, S, Se, and Te. The resin material may be one or a combination of more selected from epoxy acrylate resin, polyurethane acrylate, unsaturated polyester, acrylate resin and polyether acrylate.

For instance, the light shielding material is the foregoing $Cu_2Zn_{0.14}Sn_{0.25}Te_{2.34}$ nanocrystalline solution.

For instance, the concentration of the photosensitive resin solution is 0.5 to 100 g/L.

For instance, the organic solvent is at least one selected from ethanol, ethylene glycol, n-butanol, isobutanol, isoamylol, tertiary amyl alcohol and glycerol; or the organic solvent is at least one selected from ethylene diamine, isobutylamine, diisopropylamine, hexamethylene diamine and triethylamine; or the organic solvent is at least one selected from acetic acid, propionic acid and ethane diacid.

At least one embodiment of the present invention provides a method for manufacturing BMs. The manufacturing method is used for forming the BMs in a CF substrate. The method comprises: forming a photosensitive resin solution which is the foregoing photosensitive resin solution; cleaning a substrate obtained after forming a CF layer thereon;

spraying the photosensitive resin solution onto the side of the substrate provided with the CF layer by a solution method via a mask; and drying the substrate sprayed with the photosensitive resin solution to obtain the BMs.

For instance, the step of forming the photosensitive resin solution includes: dispersing the light shielding material into the organic solvent to form a mixed solution; and dispersing the resin into the mixed solution to form the photosensitive resin solution.

For instance, the solution method includes spray coating method, inkjet printing method and screen printing method.

At least one embodiment of the present invention provides a CF substrate, which comprises the BMs formed by the foregoing manufacturing method.

At least one embodiment of the present invention provides a $Cu_2Zn_{0.14}Sn_{0.25}Te_{2.34}$ nanocrystalline solution. The particle size of $Cu_2Zn_{0.14}Sn_{0.25}Te_{2.34}$ nanocrystallines dispersed in the $Cu_2Zn_{0.14}Sn_{0.25}Te_{2.34}$ nanocrystalline solution is 5 to 20 nm; the band gap of the $Cu_2Zn_{0.14}Sn_{0.25}Te_{2.34}$ nanocrystalline is 0.8 to 1.5 ev; and the grain surface of the $Cu_2Zn_{0.14}Sn_{0.25}Te_{2.34}$ nanocrystalline has organic functional groups. The particle size of the $Cu_2Zn_{0.14}Sn_{0.25}Te_{2.34}$ nanocrystallines in the $Cu_2Zn_{0.14}Sn_{0.25}Te_{2.34}$ nanocrystalline solution is small; the surface of the $Cu_2Zn_{0.14}Sn_{0.25}Te_{2.34}$ nanocrystallines has organic functional groups; the dispersivity is excellent; and light within the ultraviolet-visible light range is absorbed. Therefore, BMs formed by utilization of the nanocrystalline solution can obtain good light shielding performance while having a small thickness.

BRIEF DESCRIPTION OF THE DRAWINGS

Simple description will be given below to the accompanying drawings of the embodiments to provide a more clear understanding of the technical solutions of the embodiments of the present invention. Obviously, the drawings described below only involve some embodiments of the present invention. Other drawings may also be obtained by those skilled in the art without creative efforts on the basis of the accompanying drawings.

Figure 1:
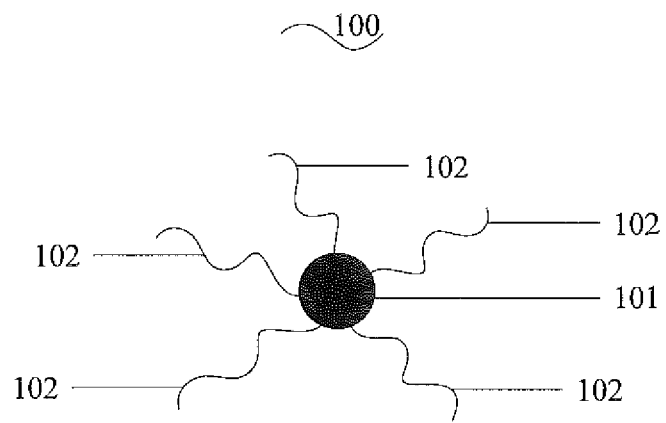
FIG. 1 is a schematic diagram of a model of a $Cu_2Zn_{0.14}Sn_{0.25}Te_{2.34}$ nanocrystalline.

Reference numerals of the accompanying drawings:
01—CF Substrate; 10—BM; 20—CF Layer; 100—$Cu_2Zn_{0.14}Sn_{0.25}Te_{2.34}$ Nanocrystalline; 101—Grain; 102—Organic Functional Group.

DETAILED DESCRIPTION

Clear and complete description will be given below to the technical solutions of the embodiments of the present invention with reference to the accompanying drawings of the embodiments of the present invention. Obviously, the preferred embodiments are only partial embodiments of the present invention, rather than all the embodiments of the present invention. All the other embodiments obtained by those skilled in the art without creative efforts on the basis of the embodiments of the present invention illustrated shall fall within the scope of protection of the present invention.

An embodiment of the present invention provides a $Cu_2Zn_{0.14}Sn_{0.25}Te_{2.34}$ nanocrystalline solution. As illustrated in FIG. 1, the $Cu_2Zn_{0.14}Sn_{0.25}Te_{2.34}$ nanocrystalline 100 dispersed in the $Cu_2Zn_{0.14}Sn_{0.25}Te_{2.34}$ nanocrystalline solution has a particle size of 5 to 20 nm; the band gap of the $Cu_2Zn_{0.14}Sn_{0.25}Te_{2.34}$ nanocrystalline 100 is 0.8 to 1.5 ev; and the surface of a grain 101 of the $Cu_2Zn_{0.14}Sn_{0.25}Te_{2.34}$ nanocrystalline 100 has organic functional groups 102.

It should be noted that: firstly, the nanocrystalline refers to a crystal the particle size of which is in nanometer level (1 to 100 nm). FIG. 1 is only a model diagram of the $Cu_2Zn_{0.14}Sn_{0.25}Te_{2.34}$ nanocrystalline 100, in which the relative size between the grain of the $Cu_2Zn_{0.14}Sn_{0.25}Te_{2.34}$ nanocrystalline 100 and the organic functional group on its surface does not correspond to the actual size.

Secondly, in the $Cu_2Zn_{0.14}Sn_{0.25}Te_{2.34}$ nanocrystalline 100 provided by the embodiment of the present invention, the grain is composed of a $Cu_2Zn_{0.14}Sn_{0.25}Te_{2.34}$ semiconductor compound which is formed by Cu element, Zn element, Sn element and Te element at a stoichiometric ratio of 2:0.14:0.25:2.34.

Thirdly, the particle size distribution, the band gap and the chemical element distribution of the $Cu_2Zn_{0.14}Sn_{0.25}Te_{2.34}$ nanocrystalline 100 can be obtained by related tests on the $Cu_2Zn_{0.14}Sn_{0.25}Te_{2.34}$ nanocrystalline solution, for example via a transmission electron microscope (TEM), an X-ray energy dispersive spectroscopy (EDS), an ultraviolet visible spectrophotometer (UV-VIS), and an inductively coupled plasma-atomic emission spectrometry (ICP-AES), in which the ratio of the metal elements in the compound can be further determined by ICP-AES analysis, and hence the molecular formula of the nanocrystalline compound of the present invention can be determined. In the $Cu_2Zn_{0.14}Sn_{0.25}Te_{2.34}$ nanocrystalline solution provided by the embodiment of the present invention, the particle size of the $Cu_2Zn_{0.14}Sn_{0.25}Te_{2.34}$ nanocrystalline 100 is 5 to 20 nm. The particle size in a nanometer level is much smaller than the particle size in a micron level of the black pigment in the prior art, and uniformity of the particle size distribution is also higher. Due to a smaller particle size, the specific surface area of the $Cu_2Zn_{0.14}Sn_{0.25}Te_{2.34}$ nanocrystalline is larger, and hence the $Cu_2Zn_{0.14}Sn_{0.25}Te_{2.34}$ nanocrystalline can be more easily and uniformly dispersed in a dispersant, which is conducive to the stability of the $Cu_2Zn_{0.14}Sn_{0.25}Te_{2.34}$ nanocrystalline solution.

Figure 2:
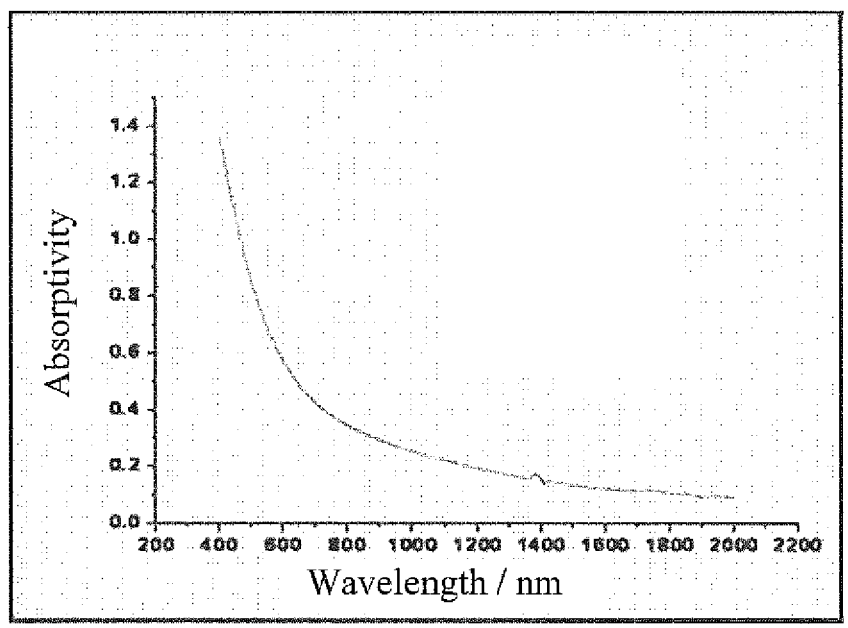
FIG. 2 is an ultraviolet-visible-near infrared absorption spectrogram of a $Cu_2Zn_{0.14}Sn_{0.25}Te_{2.34}$ nanocrystalline according to an embodiment of the present invention.

Fourthly, the band gap of the $Cu_2Zn_{0.14}Sn_{0.25}Te_{2.34}$ nanocrystalline 100 is 0.8 to 1.5 ev. it can be seen from the ultraviolet-visible absorption spectrogram of the $Cu_2Zn_{0.14}Sn_{0.25}Te_{2.34}$ nanocrystalline 100 as illustrated in FIG. 2, the $Cu_2Zn_{0.14}Sn_{0.25}Te_{2.34}$ nanocrystalline 100 has an obvious absorption band over the ultraviolet-visible range (400 nm to 700 nm), which indicates that in the $Cu_2Zn_{0.14}Sn_{0.25}Te_{2.34}$ nanocrystalline solution provided by the embodiment of the present invention, the $Cu_2Zn_{0.14}Sn_{0.25}Te_{2.34}$ nanocrystalline 100 has good UV-Vis absorption, and the BMs formed by utilization of the $Cu_2Zn_{0.14}Sn_{0.25}Te_{2.34}$ nanocrystalline solution have good light absorption characteristic.

Fifthly, as the surface of the grain 101 of the $Cu_2Zn_{0.14}Sn_{0.25}Te_{2.34}$ nanocrystalline 100 has organic functional groups 102, the $Cu_2Zn_{0.14}Sn_{0.25}Te_{2.34}$ nanocrystalline 100 may be easily dissolved in an organic solvent according to the Like Dissolves Like Theory, which facilitates forming a BM film.

No limitation will be given here to the variety and amount of the organic functional groups 102 in the embodiments of the present invention.

An embodiment of the present invention provides a $Cu_2Zn_{0.14}Sn_{0.25}Te_{2.34}$ nanocrystalline solution. The particle size of the $Cu_2Zn_{0.14}Sn_{0.25}Te_{2.34}$ nanocrystalline 100 dispersed in the $Cu_2Zn_{0.14}Sn_{0.25}Te_{2.34}$ nanocrystalline solution is 5 to 20 nm; the band gap of the $Cu_2Zn_{0.14}Sn_{0.25}Te_{2.34}$ nanocrystalline 100 is 0.8 to 1.5 ev; and the surface of a grain 101 of the $Cu_2Zn_{0.14}Sn_{0.25}Te_{2.34}$ nanocrystalline 100 has organic functional groups 102. The particle size of the $Cu_2Zn_{0.14}Sn_{0.25}Te_{2.34}$ nanocrystalline 100 in the $Cu_2Zn_{0.14}Sn_{0.25}Te_{2.34}$ nanocrystalline solution is small; the surface has the organic functional groups 102; the dispersivity is excellent; and light within the ultraviolet-visible light range can be absorbed. Therefore, the BMs formed by utilization of the nanocrystalline solution can obtain good light shielding performance while having a small thickness.

Figure 3:
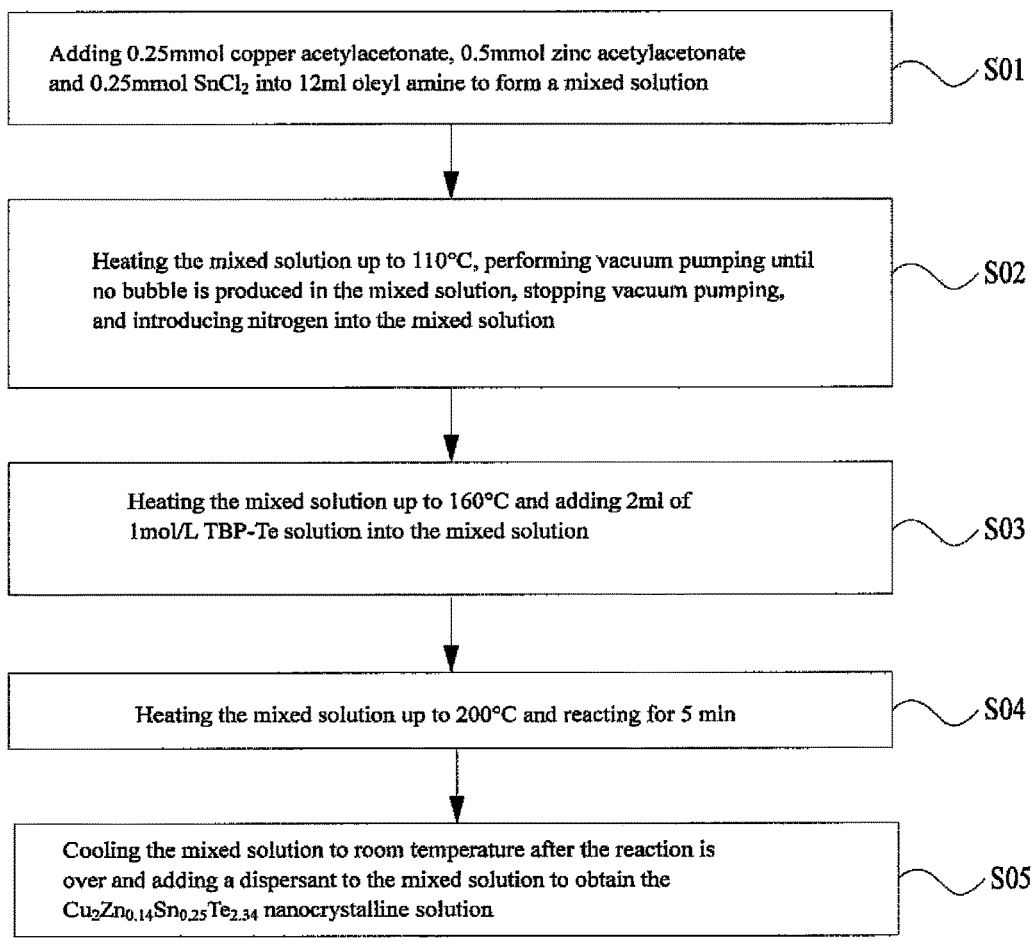
FIG. 3 is a flowchart of a method for preparing a $Cu_2Zn_{0.14}Sn_{0.25}Te_{2.34}$ nanocrystalline solution according to an embodiment of the present invention.

On this basis, an embodiment of the present invention further provides a method for preparing the $Cu_2Zn_{0.14}Sn_{0.25}Te_{2.34}$ nanocrystalline solution. As illustrated in FIG. 3, the method comprises:

S01: adding 0.25 mmol copper acetylacetonate, 0.5 mmol zinc acetylacetonate and 0.25 mmol stannous chloride into 12 ml oleyl amine to form a mixed solution.

Herein, as for the mmol (wherein mol is the unit of the amount of a substance, with a symbol of n), 1 mmol=1/1000 mol, and the conversion formula between the mol (n) and the mass (m) of the substance is as follows:

$$n = \frac{m}{M},$$

in which m refers to the mass of the substance, and M refers to the molar mass of the substance.

Taking the copper acetylacetonate (also referred to as copper(II) acetylacetonate) as an example, it has a molecular formula of $C_{10}H_{14}O_4Cu$, and the relative molecular mass is 261.76, namely the molar mass of the copper acetylacetonate is equal to 261.76, and the unit is g/mol.

As for the zinc acetylacetonate, the molecular formula is $C_{10}H_{14}O_4Zn$; the relative molecular mass is 263.6248, namely the molar mass of the zinc acetylacetonate is equal to 263.6248; and the unit is g/mol.

As for the stannous chloride, the molecular formula is $SnCl_2$; the relative molecular mass is 189.616, namely the molar mass of the stannous chloride is equal to 189.616; and the unit is g/mol.

As for the oleyl amine, the molecular formula is $C_{18}H_{37}N$; the relative molecular mass is 267.4931, namely the molar mass of the oleyl amine is equal to 267.4931; and the unit is g/mol.

It should be noted that: in the step S01, the order of the copper acetylacetonate, the zinc acetylacetonate and the stannous chloride added into the oleyl amine is not limited. For instance, the copper acetylacetonate, the zinc acetylacetonate and the stannous chloride may be added into a reaction vessel (e.g., a three-necked flask), and then the oleyl amine is introduced into the reaction vessel, and magnetic stirring or ultrasonic vibration is employed to uniformly dissolve the above reaction substances in the oleyl amine. Alternatively, the copper acetylacetonate, the zinc acetylacetonate and the stannous chloride may be added in sequence under continuous stirring or vibration.

S02: heating the mixed solution up to 110° C., performing vacuum pumping until no bubble is produced in the mixed solution, stopping vacuum pumping, and introducing nitrogen or argon into the mixed solution.

S03: heating the mixed solution up to 160° C., and adding 2 ml of 1 mol/L tributyl phosphate-tellurium (TBP-Te) precursor solution into the mixed solution.

Herein, Tributyl phosphate (TBP) has a molecular formula of $C_{12}H_{27}O_4P$ and a relative molecular mass of 266.32 and is usually used as a solvent and/or an extractant for rare metal.

S04: heating the mixed solution up to 200° C. and reacting for 5 min.

S05: cooling the mixed solution to the room temperature after the reaction process is over and adding a dispersant into the mixed solution to obtain the $Cu_2Zn_{0.14}Sn_{0.25}Te_{2.34}$ nanocrystalline solution.

It should be noted that the "room temperature", also called normal temperature or general temperature, typically has three range definitions, namely: (1) 23° C.±2° C.; (2) 25° C.±5° C.; and (3) 20° C.±5° C.

Herein, as the surface of the grain 101 of the $Cu_2Zn_{0.14}Sn_{0.25}Te_{2.34}$ nanocrystalline 100 in the $Cu_2Zn_{0.14}Sn_{0.25}Te_{2.34}$ nanocrystalline solution has the organic functional groups 102, the $Cu_2Zn_{0.14}Sn_{0.25}Te_{2.34}$ nanocrystalline 100 can maintain being in the solution state by the addition of the dispersant.

In addition, the variety and amount of the dispersant is not limited in the embodiments of the present invention, as long as the $Cu_2Zn_{0.14}Sn_{0.25}Te_{2.34}$ nanocrystallines 100 are stably dispersed in the solution to form the $Cu_2Zn_{0.14}Sn_{0.25}Te_{2.34}$ nanocrystalline solution. The dispersant may, for example, be a hydrocarbon organic solvent which has the function of dispersing the $Cu_2Zn_{0.14}Sn_{0.25}Te_{2.34}$ nanocrystallines 100 and avoiding the increase of the particle size due to mutual agglomeration.

On this basis, for instance, as for the step S03, elemental tellurium (with the chemical element of Te) may be dissolved in a TBP solvent under the protection of nitrogen or argon to obtain the TBP-Te solution.

As for the step S05, specifically, the mixed solution may be cooled to the room temperature after the reaction process is over, and n-hexane (also called hexane, with the molecular formula of $C_6H_{14}$ and the relative molecular mass of 86.2) is added into the mixed solution to obtain the $Cu_2Zn_{0.14}Sn_{0.25}Te_{2.34}$ nanocrystalline solution, in which the volume of the n-hexane added is 5 to 10 times the volume of the mixed solution.

Based on the above description, an embodiment of the present invention further provides a photosensitive resin solution for forming BMs. The photosensitive resin solution includes a light shielding material, an organic solvent and a resin, in which the light shielding material comprises a ternary or quaternary compound of Cu, Zn, Sn, S, Se, and Te.

It should be noted that the resin may be a photosensitive resin or a non-photosensitive resin. No limitation will be given here.

Moreover, the light shielding material is for example the foregoing $Cu_2Zn_{0.14}Sn_{0.25}Te_{2.34}$ nanocrystalline solution.

It should be noted that the nanocrystalline solution formed by dispersing the grains composed of a ternary or quaternary compound of Cu, Zn, Sn, S, Se, and Te into the dispersant may be easily prepared by those skilled in the art according to the preparation method disclosed by the steps S01 to S05, so the embodiment where the preferred light shielding material is the foregoing $Cu_2Zn_{0.14}Sn_{0.25}Te_{2.34}$ nanocrystalline solution does not depart from the spirit and scope of the embodiments of the present invention.

As the band gap of the CZST nanocrystalline 100 is 0.8 to 1.5 ev, the BMs formed by utilization of the photosensitive resin solution comprising the CZST nanocrystalline solution have good light absorption. Moreover, as the particle size of the CZST nanocrystalline 100 is 5 to 20 nm and the surface of the grain 101 of the CZST nanocrystalline 100 has the organic functional groups 102, namely the CZST nanocrystalline 100 has high dispersivity, and the CZST nanocrystalline 100 has high light absorption, the formed BMs can have a small thickness while having good light absorption characteristic on the whole. Therefore, the problem in the prior art that BMs with large thickness affect the flatness of a CF layer in a CF substrate can be avoided.

On this basis, the concentration of the photosensitive resin solution is 0.5 to 100 g/L.

Herein, the organic solvent in the photosensitive resin solution may be at least one selected from ethanol, ethylene glycol, n-butanol, isobutanol, isoamylol, tertiary amyl alcohol and glycerol; or the organic solvent may be at least one selected from ethylene diamine, isobutylamine, diisopropylamine, hexamethylene diamine and triethylamine; or the organic solvent may be at least one selected from acetic acid, propionic acid and ethane diacid.

On this basis, the embodiment of the present invention further provides a method for forming BMs in a CF substrate. The method comprises:

S11: forming a photosensitive resin solution which is any foregoing photosensitive resin solution.

S12: cleaning the substrate obtained after forming a CF layer thereon.

S13: spraying the photosensitive resin solution onto the side of the substrate provided with the CF layer by a solution method via a mask.

Herein, the mask is provided with a plurality of hollow portions which correspond to gaps between color resists of different colors in the CF layer, namely corresponding to areas of BMs to be formed.

S14: drying the substrate sprayed with the photosensitive resin solution to obtain the BMs.

On this basis, compared to the prior art in which the BMs are formed by vapor deposition, sputtering, etching and other methods, the method of forming the BMs by the solution method in the embodiment of the present invention at least has the following advantages:

Firstly, as multiple exposure and development in the process of forming the BMs in the prior art are avoided, the complexity of the process flow can be simplified and the consumption of raw materials can be reduced.

Secondly, as the BMs can be formed after one drying process by the above solution method, the possibility of bringing process defects in multiple processes can be reduced, improving the quality of the formed BMs and facilitating a large-scale industrial production.

Wherein the step S11 may specifically include the following substeps:

S111: dispersing the light shielding material into the organic solvent to form a mixed solution.

S112: dispersing the resin into the mixed solution to form the photosensitive resin solution.

On this basis, in the step S13, the solution method includes spray coating method, inkjet printing method and screen printing method.

In addition, the solution method may, for instance, include solution dropping method (Drop), etc.

Figure 4:
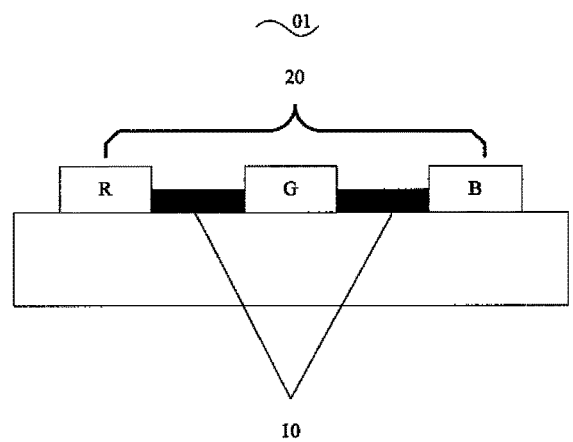
FIG. 4 is a schematic structural view of a CF substrate according to an embodiment of the present invention.

The embodiment of the present invention further provides a CF substrate 01. As illustrated in FIG. 4, the CF substrate 01 comprises the BMs 10 formed by any foregoing forming method.

It should be noted that description is given in FIG. 4 only by taking the case that the CF layer includes a plurality of red color resists (marked as R in the figure), green color resists (marked as G in the figure) and blue color resists (marked as B in the figure) as an example, but the embodiments of the present invention are not limited thereto. The CF layer may, for instance, include color resists of other colors.

The foregoing is only the preferred embodiments of the present invention and not intended to limit the scope of protection of the present invention. Any change or replacement that may be easily conceived of by those skilled in the art within the technical scope disclosed by the present invention shall fall within the scope of protection of the present invention. Therefore, the scope of protection of the present invention shall be defined by the appended claims.

The application claims priority to the Chinese patent application No. 201410252354.5 filed on Jun. 9, 2014, the disclosure of which is incorporated herein by reference as part of the application.

What is claimed is:

1. A $Cu_2Zn_{0.14}Sn_{0.25}Te_{2.34}$ nanocrystalline solution, wherein the particle size of $Cu_2Zn_{0.14}Sn_{0.25}Te_{2.34}$ nanocrystallines dispersed in the $Cu_2Zn_{0.14}Sn_{0.25}Te_{2.34}$ nanocrystalline solution is 5 to 20 nm; the band gap of the $Cu_2Zn_{0.14}Sn_{0.25}Te_{2.34}$ nanocrystallines is 0.8 to 1.5 ev; and the grain surface of the $Cu_2Zn_{0.14}Sn_{0.25}Te_{2.34}$ nanocrystallines has organic functional groups.

2. A method for preparing the $Cu_2Zn_{0.14}Sn_{0.25}Te_{2.34}$ nanocrystalline solution according to claim 1, comprising:
adding 0.1 to 1 mmol copper acetylacetonate, 0.2 to 2 mmol zinc acetylacetonate and 0.1 to 1 mmol stannous chloride into 5 to 50 ml oleyl amine to form a mixed solution;
heating the mixed solution up to 100-150° C., performing vacuum pumping until no bubble is produced in the mixed solution, stopping vacuum pumping, and introducing nitrogen, argon or other inert gas into the mixed solution;
heating the mixed solution up to 120-180° C., and adding 1 to 10 ml of 1 mol/L tributyl phosphate-tellurium (TBP-Te) precursor solution into the mixed solution;
heating the mixed solution up to 150-220° C., and reacting for 5 to 10 min; and
cooling the mixed solution to the room temperature after the reaction process is over, and adding a dispersant into the mixed solution to obtain the $Cu_2Zn_{0.14}Sn_{0.25}Te_{2.34}$ nanocrystalline solution,
wherein the tributyl phosphate-tellurium (TBP-Te) precursor solution is obtained by dissolving elemental tellurium in a tributyl phosphate (TBP) solvent under the protection of protective atmosphere.

3. The preparation method according to claim 2, comprising:
adding 0.25 mmol copper acetylacetonate, 0.5 mmol zinc acetylacetonate, and 0.25 mmol stannous chloride into 12 ml oleyl amine to form a mixed solution;
heating the mixed solution up to 110° C., performing vacuum pumping until no bubble is produced in the mixed solution, stopping vacuum pumping, and introducing nitrogen into the mixed solution;

heating the mixed solution up to 160° C., and adding 2 ml of 1 mol/L tributyl phosphate-tellurium (TBP-Te) precursor solution into the mixed solution;

heating the mixed solution up to 200° C., and reacting for 5 min; and cooling the mixed solution to the room temperature after the reaction process is over, and adding a dispersant into the mixed solution to obtain the $Cu_2Zn_{0.14}Sn_{0.25}Te_{2.34}$ nanocrystalline solution.

4. The preparation method according to claim 3, wherein the step of cooling the mixed solution to the room temperature after the reaction process is over and adding the dispersant into the mixed solution to obtain the $Cu_2Zn_{0.14}Sn_{0.25}Te_{2.34}$ nanocrystalline solution includes:

cooling the mixed solution to the room temperature after the reaction process is over and adding n-hexane into the mixed solution to obtain the $Cu_2Zn_{0.14}Sn_{0.25}Te_{2.34}$ nanocrystalline solution, in which the volume of the n-hexane added is 5 to 10 times the volume of the mixed solution.

5. The preparation method according to claim 2, wherein the step of cooling the mixed solution to the room temperature after the reaction process is over and adding the dispersant into the mixed solution to obtain the $Cu_2Zn_{0.14}Sn_{0.25}Te_{2.34}$ nanocrystalline solution includes:

cooling the mixed solution to the room temperature after the reaction process is over and adding n-hexane into the mixed solution to obtain the $Cu_2Zn_{0.14}Sn_{0.25}Te_{2.34}$ nanocrystalline solution, in which the volume of the n-hexane added is 5 to 10 times the volume of the mixed solution.

6. A photosensitive resin solution for forming black matrix, comprising a light shielding material, an organic solvent and a resin, wherein the light shielding material is the $Cu_2Zn_{0.14}Sn_{0.25}Te_{2.34}$ nanocrystalline solution according to claim 1.

7. The photosensitive resin solution according to claim 6, wherein the concentration of the light shielding material in the photosensitive resin solution is 0.5 to 100 g/L.

8. The photosensitive resin solution according to claim 6, wherein the organic solvent is at least one selected from ethanol, ethylene glycol, n-butanol, isobutanol, isoamylol, tertiary amyl alcohol and glycerol; or the organic solvent is at least one selected from ethylene diamine, isobutylamine, diisopropylamine, hexamethylene diamine and triethylamine; or the organic solvent is at least one selected from acetic acid, propionic acid and ethane diacid.

9. A method for manufacturing black matrix, wherein the manufacturing method is used for forming the black matrix in a CF substrate and comprises:

forming a photosensitive resin solution which is the photosensitive resin solution according to claim 6;

cleaning a substrate obtained after forming a CF layer thereon;

spraying the photosensitive resin solution onto the side of the substrate provided with the CF layer by a solution method via a mask; and drying the substrate sprayed with the photosensitive resin solution to obtain the black matrix.

10. The manufacturing method according to claim 9, wherein the step of forming the photosensitive resin solution includes:

dispersing the light shielding material into the organic solvent to form a mixed solution; and dispersing the resin into the mixed solution to form the photosensitive resin solution.

11. The manufacturing method according to claim 9, wherein the solution method includes spray coating method, inkjet printing method, or screen printing method.

* * * * *